United States Patent
Avidano et al.

(10) Patent No.: US 6,300,740 B1
(45) Date of Patent: Oct. 9, 2001

(54) CIRCUIT FOR DRIVING INDUCTIVE LOADS

(75) Inventors: Maurizio Avidano, Nichelino; Pierfranco Pangella, Buttigliera d'Asti, both of (IT)

(73) Assignee: Gate S.p.A., Turin (IT)

( * ) Notice: Subject to any disclaimer, the term of this patent is extended or adjusted under 35 U.S.C. 154(b) by 0 days.

(21) Appl. No.: 09/500,078

(22) Filed: Feb. 8, 2000

(30) Foreign Application Priority Data

Feb. 12, 1999 (IT) ................................. TO99A0104

(51) Int. Cl.[7] ................. H02P 1/24; H02P 1/42; H02P 3/18; H02P 5/28; H02P 7/36
(52) U.S. Cl. ..................... 318/727; 318/738; 363/46; 363/47
(58) Field of Search ................. 318/727, 738, 318/244, 245, 599, 254, 138, 139, 439, 519; 388/804, 819, 811, 831; 323/351; 363/39, 46, 47, 48

(56) References Cited

U.S. PATENT DOCUMENTS

| | | | |
|---|---|---|---|
| 4,673,851 | * 6/1987 | Disser ................................ | 318/341 |
| 4,831,469 | * 5/1989 | Hanson et al. ..................... | 360/75 |
| 5,844,786 | * 12/1998 | Yoshida et al. .................... | 363/21 |
| 5,942,864 | * 8/1999 | Charreton ........................... | 318/254 |

FOREIGN PATENT DOCUMENTS

| | | | |
|---|---|---|---|
| 44 44 492 | * 6/1996 | (DE) ......................... | H02P/7/298 |
| 0 964 507 A | 12/1999 | (EP) . | |

\* cited by examiner

*Primary Examiner*—Robert E. Nappi
*Assistant Examiner*—Edgardo San Martin
(74) *Attorney, Agent, or Firm*—Sughrue, Mion, Zinn, Macpeak & Seas, PLLC

(57) ABSTRACT

A circuit comprises at least one electronic switch which is operatively connected to an inductive load, is intended to be driven by means of an on-off signal and, in an enabled condition, can connect the load to a direct-current voltage supply, at least one freewheeling circuit branch which comprises a diode and can recirculate the transient current which flows through the load each time the switch is disabled, and a filtering circuit connected between the diode and the voltage supply and comprising a parallel capacitor connected to the diode and a series inductor connected between the diode and the voltage supply. The freewheeling circuit branch and the filtering circuit are connected substantially in series with one another in a circuit branch which is operatively connected in parallel with the load.

6 Claims, 6 Drawing Sheets

CIRCUIT FOR DRIVING INDUCTIVE LOADS

BACKGROUND OF THE INVENTION

The present invention relates to a circuit for driving inductive loads.

More specifically, the subject of the invention is a driving circuit comprising:

- at least one electronic switch which is operatively connected substantially in series with an inductive load and, in an enabled condition, can connect the load to a direct-current voltage supply, the switch being intended to be driven by an on-off signal,
- at least one freewheeling circuit branch which comprises a diode and can recirculate the transient current which flows through the load each time the switch is disabled, and
- a filtering circuit connected between the cathode of the diode and the voltage supply and comprising a parallel capacitor connected to the cathode of the diode and a series inductor connected between the cathode of the diode and the voltage supply.

FIG. 1 of the appended drawings shows a diagram of a driving circuit of this type according to the prior art. In this drawing, an inductive load, such as the rotor winding of a direct-current electric motor with brushes, is indicated W. The driving circuit comprises an electronic switch Q, such as an n-channel MOSFET transistor, connected substantially in series with the load W, between the load and the earth GND. The terminal of the load W remote from the switch Q is connected to the positive terminal of a direct-current voltage supply such as a battery B, by means of a filtering circuit generally indicated FC. The driving circuit further comprises a freewheeling branch FB including a diode D having its anode connected to the terminal of the load W which is connected to the switch Q and its cathode connected to the other terminal of the load W.

The freewheeling circuit branch can limit the overvoltages which are created when the switch is opened and can restrict power losses as is required in the driving technique using a pulse-width modulated signal (PWM).

The filtering circuit serves to limit the amplitude of the variable components of the current in the supply line, as is required by the standards in force for equipment in motor vehicles in order not to transmit interference to other loads connected to the same supply line.

The most usual embodiment of the filtering circuit FC comprises a parallel capacitor C connected between the cathode of the diode D and the earth, a series inductor LF, and a capacitor CF substantially in parallel with the voltage supply B.

In the circuit according to the prior art shown in FIG. 1, the freewheeling circuit branch FB is connected in parallel with the load W. The parallel circuit comprising the load and the freewheeling circuit branch FB is connected substantially in series with the filtering circuit FC.

In operation, an on-off driving signal, for example, of the pulse-width modulated type (PWM), is applied to the control input (the gate) of the switch Q.

The topography of the circuit according to the prior art described above is such that, in operation, substantially the entire current which circulates operatively in the load W flows through the inductor LF of the filtering circuit FC.

This inductor has a resistive component and, in operation, it therefore dissipates a large amount of electrical power as heat. This leads to a reduction in efficiency in operation and to problems from the point of view of the physical location of the filter inductor LF which, in some applications, preferably has to be arranged remote from the rest of the circuit or has to have a suitable heat dissipator.

SUMMARY OF THE INVENTION

An object of the present invention is therefore to provide a driving circuit of the type defined at the beginning in which the power dissipation in the inductor of the filtering circuit is considerably reduced.

This and other objects are achieved, according to the invention, by the driving circuit the main characteristics of which are defined in appended claim 1.

BRIEF DESCRIPTION OF THE DRAWINGS

Further characteristics and advantages of the invention will become clear from the following detailed description, given purely by way of non-limiting example, with reference to the appended drawings, in which.

DETAILED DESCRIPTION OF THE INVENTION

Figure 1:
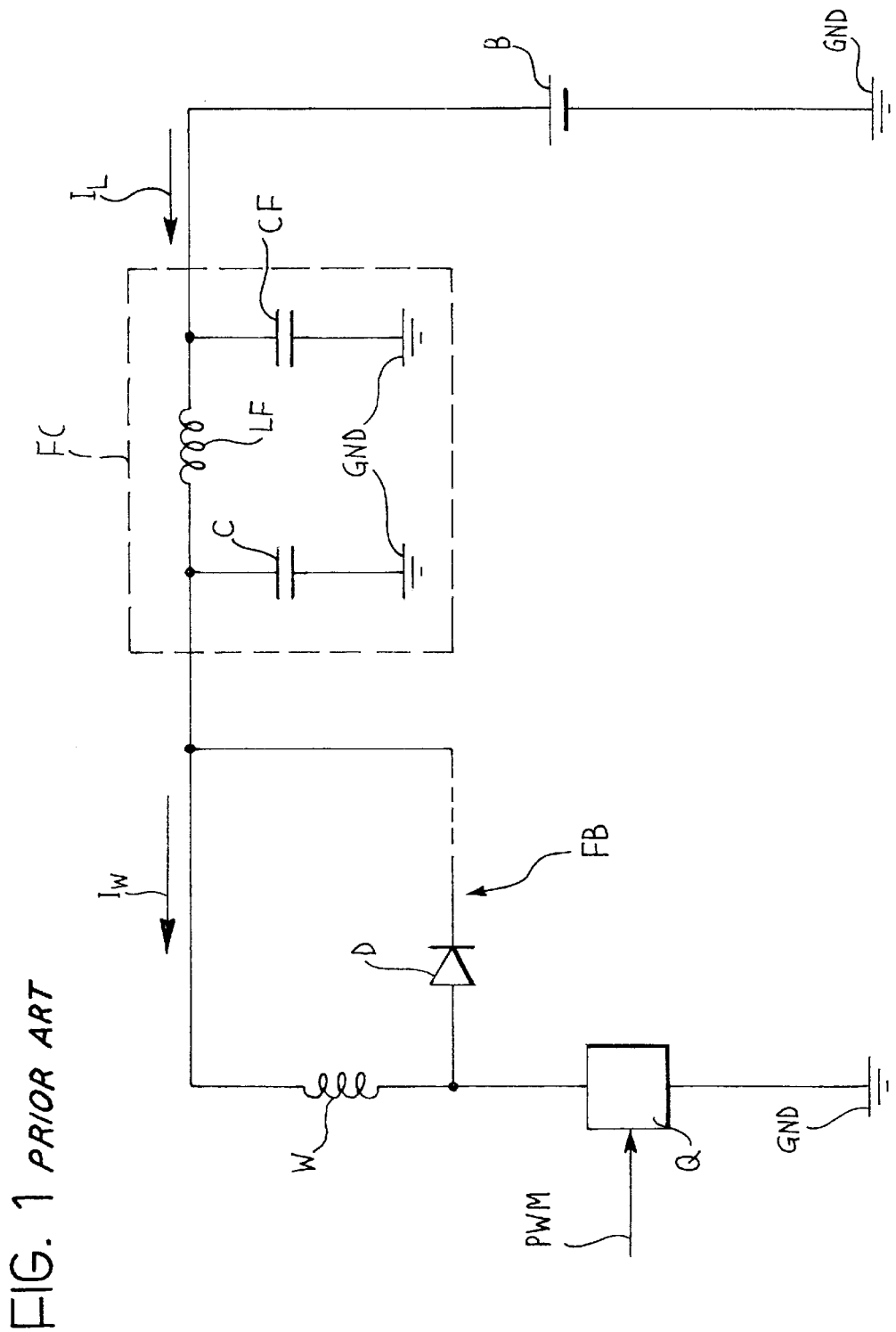
FIG. 1, which has already been described, is a diagram of a circuit for driving inductive loads according to the prior art.
Figure 2:
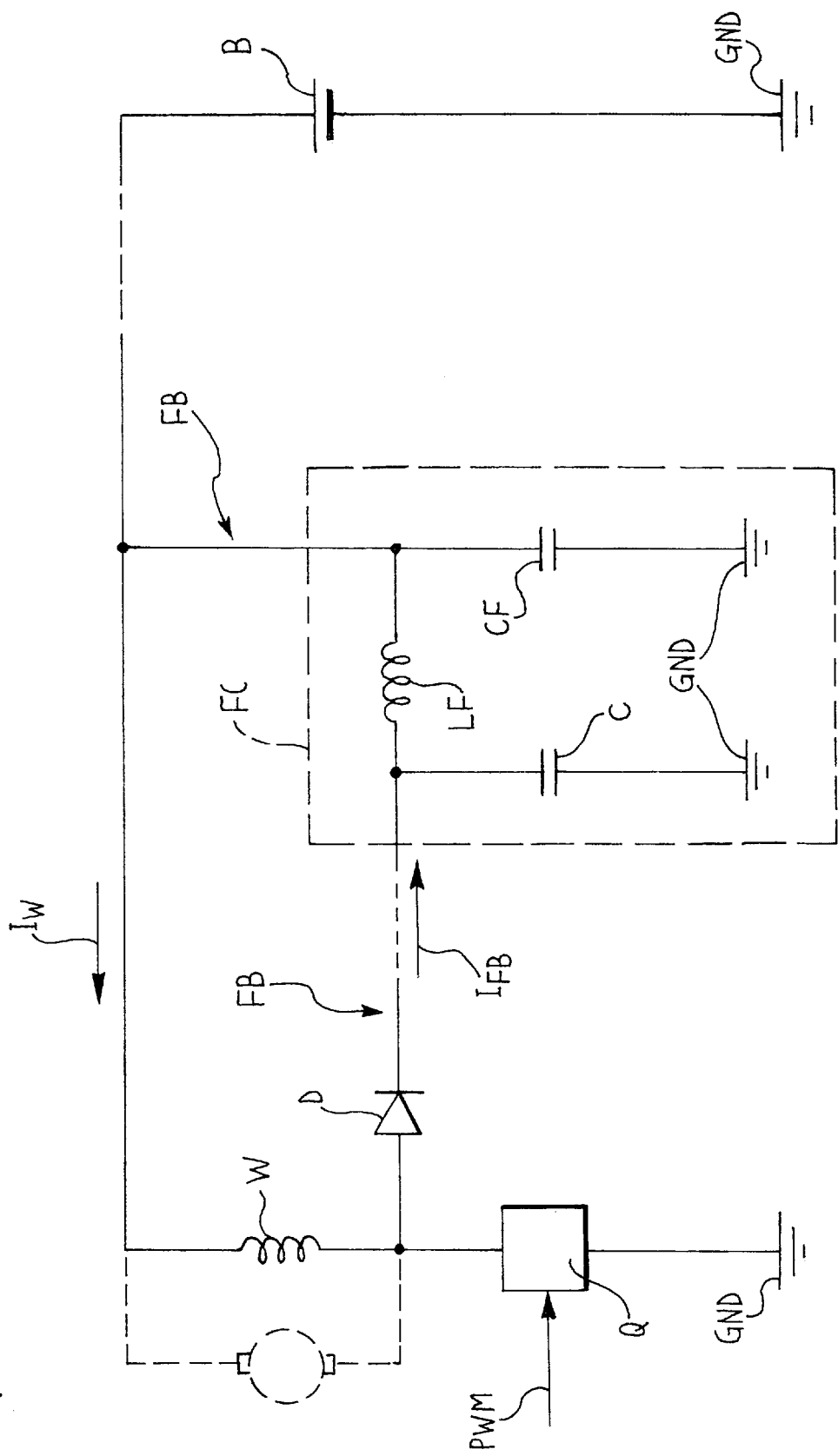
FIG. 2 is a diagram of a driving circuit according to the invention.

FIG. 2 shows a driving circuit according to the invention for an inductive load W such as a rotor winding of a direct-current electric motor with a commutator. In FIG. 2, parts and elements which have already been described with reference to FIG. 1 have again been attributed the same reference letters.

In the circuit according to FIG. 2, the filtering circuit FC is connected substantially in series with the freewheeling diode D in a circuit branch FB connected in parallel with the load W. The terminal of the load W remote from the electronic switch Q is connected directly to the positive terminal of the direct-current voltage supply B.

The driving circuit according to FIG. 2 substantially reduces the power dissipated in the inductor LF of the filter FC in operation, as will now be explained.

With reference to FIG. 1, if the current flowing from the voltage supply B towards the load through the filter FC is indicated $I_L$ and if the current actually flowing in the load is indicated $I_W$, the power $P_{LF}$ dissipated by the Joule effect in the resistive component $R_{LF}$ of the inductor LF is expressed substantially as follows:

$$P_{LF} = R_{LF} \cdot I_L^2 \tag{1}$$

This expression is valid if the values of the components of the filter are such as to render the ripple of the current in the inductor LF substantially negligible.

If the signal PWM applied to the control input of the electronic switch Q has a duty-cycle $DC=t_{on}/T$, the expression (1) given above can be rewritten as follows:

$$P_{LF}=R_{LF}\cdot(I_W\cdot DC)^2=R_{LF}\cdot(I_W)^2\cdot(t_{on}/T)^2 \quad (2)$$

In the expression given above, the period of the signal PWM applied to the gate of the electronic switch Q is indicated T and the time for which the switch Q is made conductive within each period T is indicated $t_{on}$.

In the circuit according to the invention shown in FIG. 2, the power dissipated by the Joule effect in the resistive component $R_{LF}$ of the inductor of the filter LF is given by $$P_{LF}=R_{LF}\cdot I_{FB}^2 \quad (3)$$

in which $I_{FB}$ is the current flowing in the freewheeling circuit branch, as indicated in FIG. 2.

Equation (3) is also valid upon the assumption indicated above with reference to equation (1).

Since, in the circuit of FIG. 2, $$I_{FB}=I_W\cdot(1-DC)=I_W\cdot(t_{off}/T) \quad (4)$$

in which $t_{off}$ is the time, within each period T, for which the switch Q is disabled, equation (3) given above can be rewritten as follows:

$$P_{LF} = R_{LF}\cdot(I_W)^2\cdot(t_{off}/T)^2 = \quad (5)$$
$$= R_{LF}(I_W)^2\cdot(t_{on}/T)^2\cdot(t_{off}/t_{on})^2$$

It is clear from a comparison of equations (2) and (5) given above, that the driving circuit according to FIG. 2 enables the power dissipated $P_{LF}$ to be reduced basically by the factor $(t_{off}/t_{on})^2$.

In effect, the power $P_{LF}$ is reduced if $t_{off}$ is shorter than $t_{on}$.

This condition is in fact generally satisfied, in particular in the case of a load constituted by a motor, when the motor is driven at high speed and hence with long $t_{on}$ times for the electronic switch Q.

As can easily be confirmed, the appearance of an electromotive force induced in the inductor tends to reduce the value of $t_{off}/t_{on}$.

The solution described above with reference to FIG. 2 thus reduces thermal dissipation and renders the location of the inductor in the filtering circuit non-critical.

Figure 3:
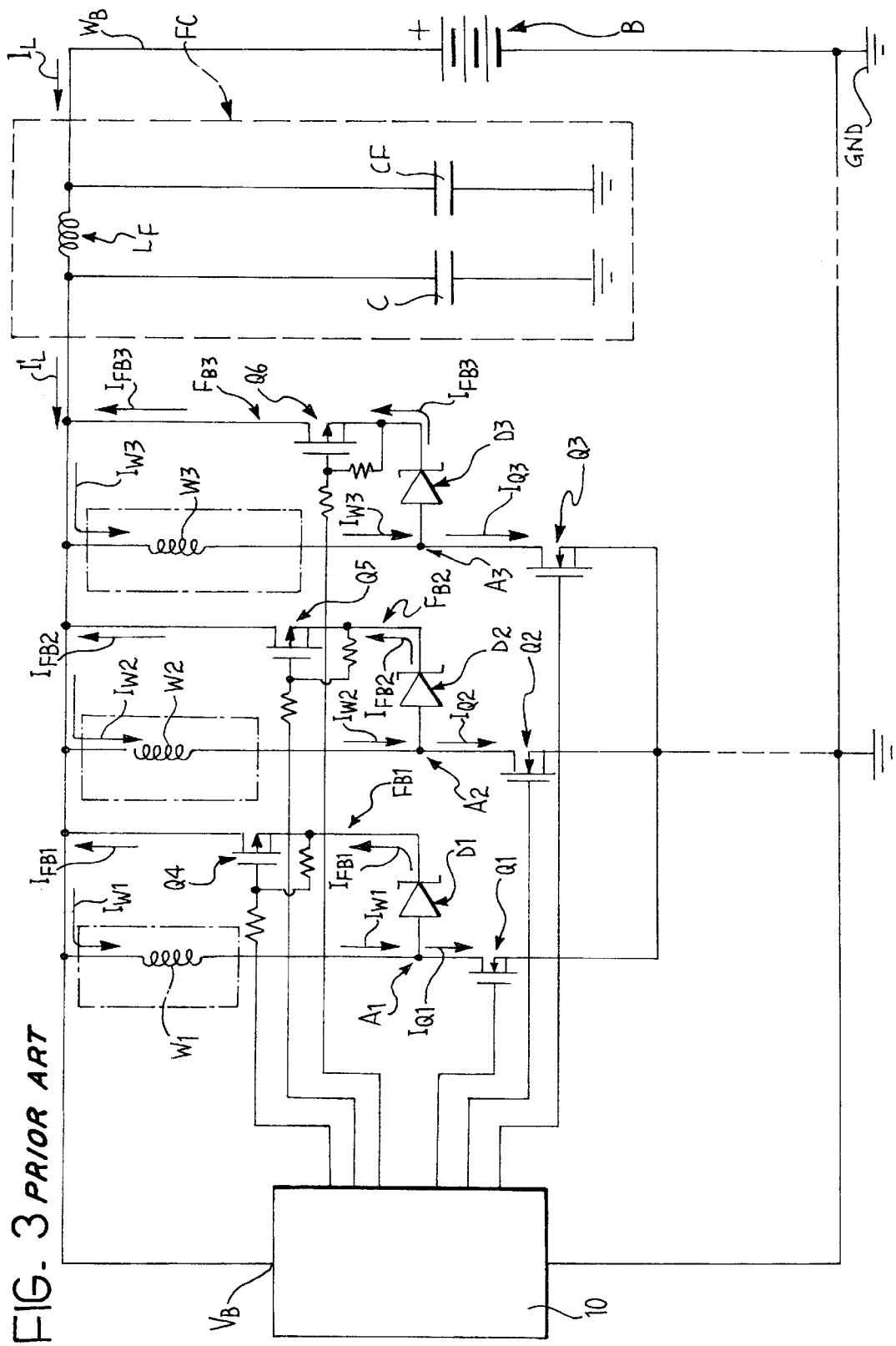
FIG. 3 is a diagram of a circuit for driving a commutatorless electric motor according to the prior art.

FIG. 3 shows a circuit according to the prior art for driving a commutatorless electric motor. In particular, the diagram of FIG. 3 shows a driving circuit according to the prior art for a three-phase, half-wave, brushless electric motor.

The stator phases or windings of an electric motor of this type are indicated W1, W2 and W3 and are connected in a star configuration the common terminal of which is connected to the positive terminal of the direct-current voltage supply B by means of a filtering circuit FC of the type already described above. The other terminals of the phases W1, W2 and W3, indicated A1, A2 and A3, are connected to the drain electrodes of three respective phase switches Q1, Q2, Q3 constituted, for example, by n-channel MOSFET transistors. The source electrodes of these transistors are connected to the earth GND.

A respective freewheeling circuit branch FB1, FB2, FB3 is arranged in parallel with each phase winding and comprises a freewheeling diode D1, D2, D3, the anode of which is connected to the terminal A1, A2, A3 of the corresponding phase.

In the embodiment shown in FIG. 3, which is described in detail in the Applicant's prior European patent application No. 0 964 507, each freewheeling circuit branch FB1, FB2, FB3 further comprises a respective freewheeling transistor Q4, Q5, Q6 in series with the diode D1, D2, D3.

The freewheeling transistors may be formed as p-channel MOSFET transistors of which the source electrodes are connected in series with the cathode of the corresponding diodes and the drain electrodes are connected to the voltage supply B by means of the filtering circuit FC.

The gate electrodes of the phase transistors Q1, Q2, Q3 and of the freewheeling transistors Q4, Q5, Q6 are connected to the outputs of a driving circuit 10 which is supplied by the same supply B, by means of the filtering circuit FC, and which can supply enabling signals to the transistors to render them conductive selectively and cyclically in predetermined manner. In particular, the driving signals applied to the gates of the phase transistors Q1, Q2, Q3 are pulse-width modulated, on-off signals (PWM). These signals are applied selectively to the gates of the phase transistors Q1, Q2, and Q3 when the rotor (not shown) of the brushless motor passes through a predetermined angular position. The application of the driving signal PWM to the gate of a phase transistor may be interrupted in advance of the application of the driving signal PWM to the next phase transistor. However, the driving signal PWM may be applied simultaneously to two phase transistors for a short period of time in order to reduce losses of torque which would occur upon phase switching.

The freewheeling transistors Q4, QS, Q6, if they are present, are made conductive selectively to allow current to flow from each phase winding to the voltage supply B during each half-wave of the electromotive force induced in the corresponding winding during which the associated electronic phase switch is driven by the signal PWM, as described in the prior patent application cited above.

With regard to the dissipation of power in the inductor LF of the filtering circuit FC, the driving circuit according to the prior art shown in FIG. 3 suffers from the same disadvantages as are described above with reference to the circuit of FIG. 1.

In FIG. 3, the current supplied by the supply B to the three-phase brushless electric motor is indicated $I_L$ and the current downstream of the filter FC is indicated $I'_L$. The currents flowing in the individual phase windings as a result of the application of a driving signal PWM to the gates of the associated phase switches Q1, Q2, Q3 ($Q_i$; i=1–3) are indicated $I_{Wi}$. The current correspondingly flowing in the phase transistor $Q_i$ is indicated $I_{Qi}$. The currents flowing in the freewheeling circuit branches associated with the individual phases are indicated $I_{FBi}$.

Figure 4:
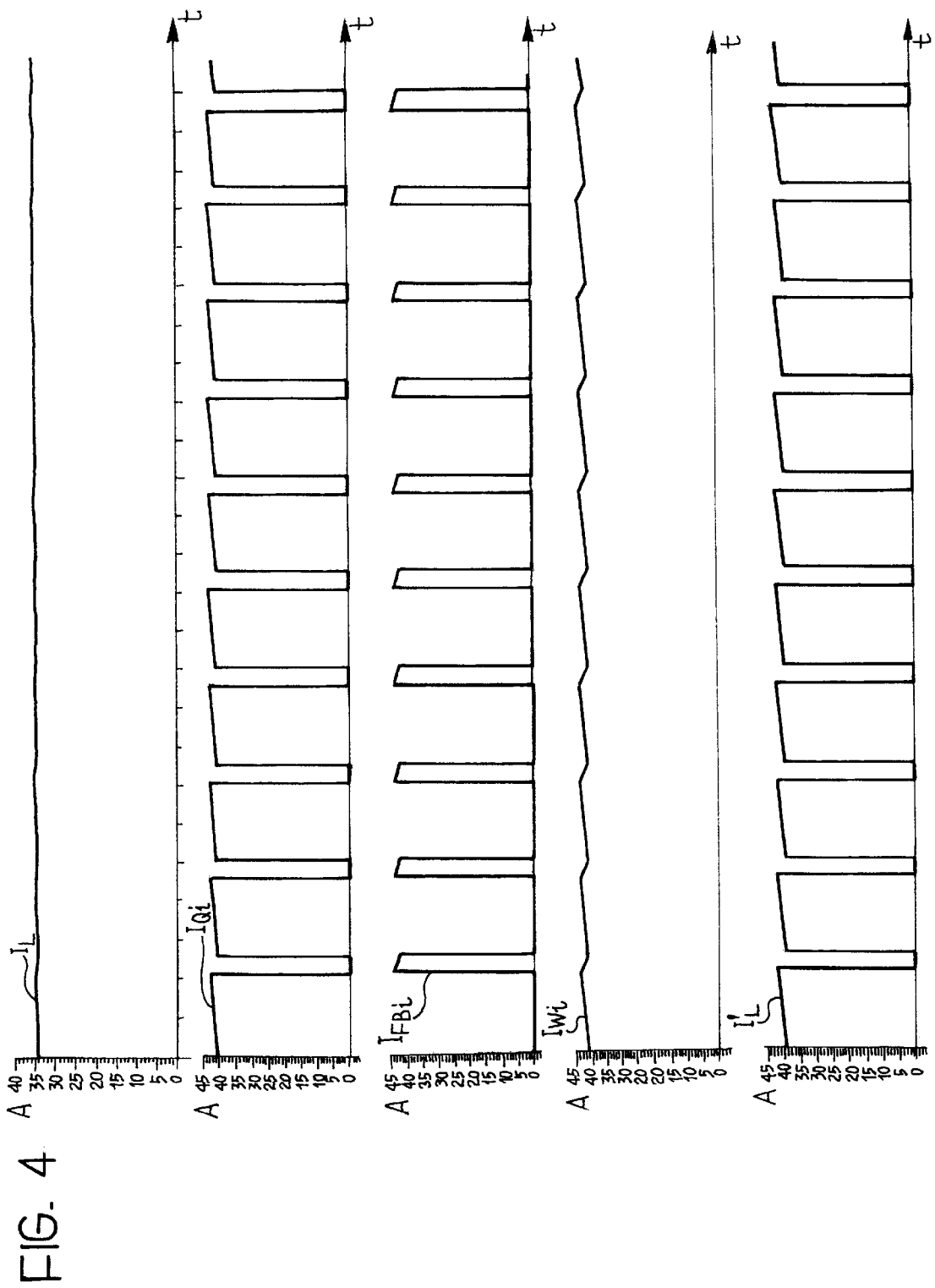
FIG. 4 is a series of graphs showing, qualitatively, the curves of some electrical currents in the circuit of FIG. 3, as functions of time.

Examples of curves of these quantities are shown in FIG. 4.

As can be seen from an observation of these graphs, the phase current $I_{Wi}$ flowing in the individual phase $W_i$ is represented substantially by the superimposition of the current $I_{Qi}$ flowing in the associated phase switch and the freewheeling current $I_{FBi}$ flowing in the associated freewheeling circuit branch.

The current $I_L$ which the supply B supplies to the load represented by the motor and by the associated driving circuit has a very slight ripple.

It should be noted that, in the absence of the inductive filter in series with the supply line, the current absorbed would have the appearance indicated $I'_L$ in FIG. 4, that is, a square-wave curve with a very great ripple. The ripple would remain very great, however, if a purely capacitive filter were used. In the circuits of the prior art, it was therefore necessary to accept an unfavourable compromise between the residual ripple and the dimensions and thermal dissipation of the inductor of the filter.

Figure 5:
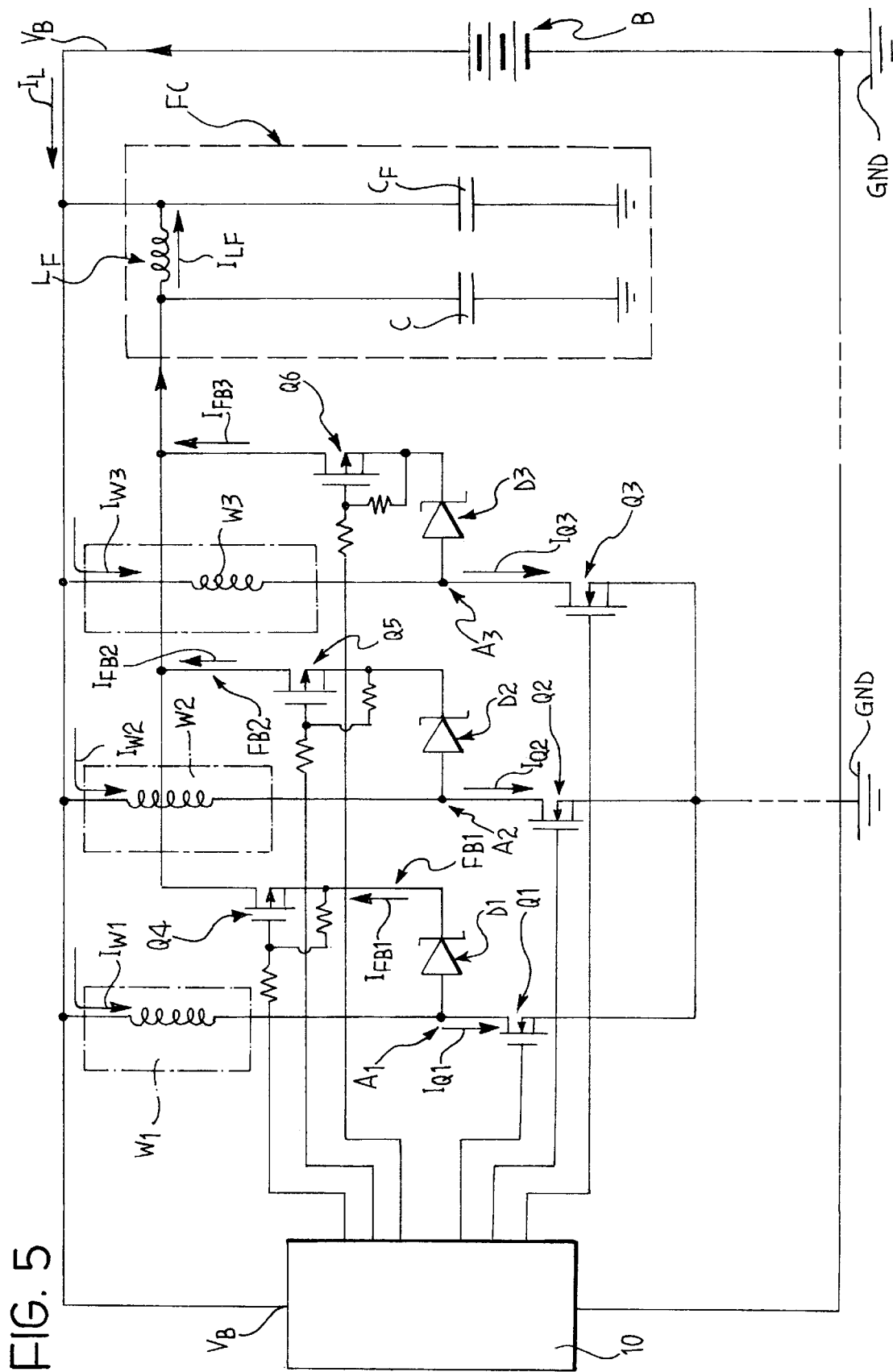
FIG. 5 is the electrical diagram of a circuit for driving a commutatorless electric motor according to the invention.

FIG. 5 shows a circuit according to the invention for driving a three-phase, half-wave, brushless electric motor.

In the diagram of FIG. 5 it can easily be seen that the terminals of the phases W1, W2, W3 remote from the phase terminals A1, A2, A3 are connected directly to the positive terminal of the voltage supply B. Moreover, the filtering circuit FC is disposed between the freewheeling diodes D1, D2, D3 (and any freewheeling electronic switches Q4, Q5, Q6) and the positive terminal of the supply B.

The currents in the individual phase windings W1, W2, W3 are also indicated $I_{Wi}$ in FIG. 5. The currents in the phase switches Q1, Q2, Q3 are indicated $I_{Qi}$, and the corresponding currents in the freewheeling circuit branches are indicated $I_{FBi}$. The current supplied by the voltage supply B to the load represented by the motor and by the associated driving circuit is again indicated $I_L$.

The current flowing in the inductor LF of the filtering circuit FC, on the other hand, is indicated $I_{LF}$.

Figure 6:
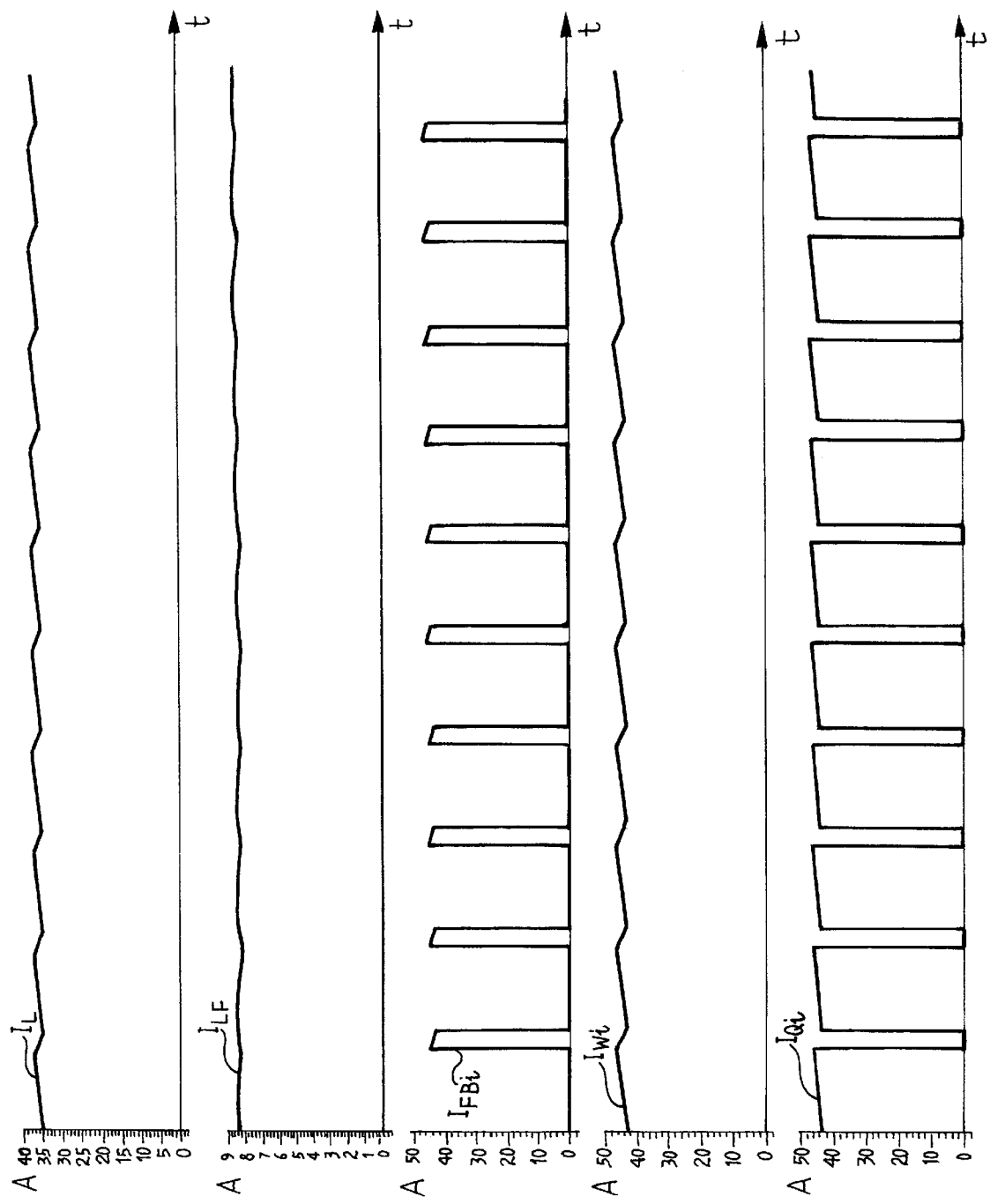
FIG. 6 is a series of graphs showing, qualitatively, the curves of electrical currents in the circuit according to FIG. 5, as functions of time.

Corresponding examples of curves of the above-mentioned currents are shown in FIG. 6.

It will be noted that, in operation, the current flowing in the filter inductor LF is equal to the direct component of the freewheeling current $I_{FBi}$ present at the time in question, the alternating component of this freewheeling current $I_{FBi}$ being earthed via the parallel capacitor C of the filtering circuit FC.

As can be seen, the intensity of the current $I_{LF}$ flowing in the filter inductor LF is distinctly less than that of the current $I_L$. The dissipation in the filter inductor LF is thus correspondingly reduced.

The arrangement of the filtering circuit FC shown in FIG. 5 thus effectively solves the problem set out at the beginning of the present description. The "price" of this arrangement is a slightly increased "ripple" of the current $I_L$, as can be seen from a direct comparison of the corresponding graphs of FIGS. 4 and 6.

However, this disadvantage is more than amply balanced by the advantage represented by the substantial reduction in thermal dissipation.

Naturally, the principle of the invention remaining the same, the forms of embodiment and details of construction may be varied widely with respect to those described and illustrated purely by way of non-limiting example, without thereby departing from the scope of the invention, as defined in the appended claims.

What is claimed is:

1. A circuit for driving inductive loads comprising:
   at least one electronic switch which is operatively connected substantially in series with an inductive load is intended to be driven by means of an on-off signal and, in an enabled condition, can connect the load to a direct-current voltage supply, at least one freewheeling circuit branch which comprises a diode and can recirculate the transient current which flows through the load each time the switch is disabled, and a filtering circuit connected between the diode and the voltage supply and comprising a parallel capacitor connected to the diode and a series inductor connected between the diode and the voltage supply, the freewheeling circuit branch and the filtering circuit being connected substantially in series with one another in a circuit branch which is operatively connected in parallel with the load.

2. A circuit according to claim 1, wherein the freewheeling circuit branch is connected by means of the filtering circuit to a point which is operatively at an electrical potential substantially coinciding with the voltage of the supply to which the inductive load is connected.

3. A circuit according to claim 1 for driving the phases of a brushless electric motor having a rotor with permanent magnets, in which alternating electromotive forces are generated in the phases in operation, each phase being associated with a freewheeling circuit branch comprising a diode which is connected to the filtering circuit by means of an associated freewheeling electronic switch.

4. A circuit according to claim 1 in which the on-off signal is a pulse-width modulated signal.

5. Use of a circuit according to claim 1 for driving a direct-current motor with a commutator.

6. Use of a circuit according to claim 1 for driving a brushless motor.

* * * * *